(12) United States Patent
Chen

(10) Patent No.: US 11,227,927 B2
(45) Date of Patent: Jan. 18, 2022

(54) SEMICONDUCTOR DEVICE

(71) Applicant: Mitsubishi Electric Corporation, Tokyo (JP)

(72) Inventor: Ze Chen, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 17/011,456

(22) Filed: Sep. 3, 2020

(65) Prior Publication Data

US 2021/0257473 A1   Aug. 19, 2021

(30) Foreign Application Priority Data

Feb. 6, 2020   (JP) .............................. JP2020-018914

(51) Int. Cl.
*H01L 29/423*   (2006.01)
*H01L 29/739*   (2006.01)
*H01L 29/06*   (2006.01)

(52) U.S. Cl.
CPC ...... *H01L 29/4236* (2013.01); *H01L 29/0696* (2013.01); *H01L 29/7397* (2013.01)

(58) Field of Classification Search
CPC ............. H01L 29/4236; H01L 29/0696; H01L 29/7397
USPC ....................................................... 257/124
See application file for complete search history.

(56) References Cited

U.S. PATENT DOCUMENTS

| 2004/0084722 | A1* | 5/2004 | Yamaguchi | ......... H01L 29/7394 257/330 |
| 2013/0037853 | A1* | 2/2013 | Onozawa | ............ H01L 29/0839 257/139 |
| 2013/0075784 | A1* | 3/2013 | Ikeda | .................. H01L 29/7397 257/140 |
| 2018/0204909 | A1* | 7/2018 | Konishi | ............. H01L 29/1095 |
| 2018/0323294 | A1* | 11/2018 | Okuda | .................. H01L 29/861 |
| 2019/0312113 | A1* | 10/2019 | Chen | .................. H01L 29/0619 |

FOREIGN PATENT DOCUMENTS

JP      2019-186318 A      10/2019

* cited by examiner

*Primary Examiner* — Igwe U Anya
(74) *Attorney, Agent, or Firm* — Studebaker & Brackett PC

(57) ABSTRACT

Plural gate trenches are formed on an upper surface side of a semiconductor substrate of a first conductivity type. Gate electrodes are embedded in the plural gate trenches. Plural dummy gate trenches are formed at equivalent intervals between the neighboring gate trenches on the upper surface side of the semiconductor substrate. Dummy gate electrodes are embedded in the plural dummy gate trenches and connected with an emitter electrode. An interval between the gate trench and the dummy gate trench that neighbor each other is shorter than an interval between the neighboring dummy gate trenches.

16 Claims, 19 Drawing Sheets

SEMICONDUCTOR DEVICE

BACKGROUND OF THE INVENTION

Field

The present disclosure relates to a semiconductor device.

Background

A semiconductor device has been suggested in which plural dummy trenches are formed between neighboring gate trenches and the gate trench is shallower than the dummy trench (for example, see JP 2019-186318 A).

SUMMARY

In semiconductor devices in related art, all trenches including gate trenches and dummy trenches have been provided at constant intervals. Consequently, there has been a concern that the semiconductor device has a peculiar capacitance characteristic waveform and may thus incur oscillation or malfunction of a device.

The present disclosure has been made for solving the above-described problem, and one object thereof is to obtain a semiconductor device that may improve capacitance characteristics.

A semiconductor device according to the present disclosure includes: a semiconductor substrate of a first conductivity type; plural gate trenches formed on an upper surface side of the semiconductor substrate; gate electrodes embedded in the plural gate trenches; a gate insulation film formed between the gate electrodes and the semiconductor substrate; a channel layer of a second conductivity type formed in a surface layer portion on the upper surface side of the semiconductor substrate; a contact layer of the second conductivity type having a higher impurity peak concentration than the channel layer and formed in a surface layer portion of the channel layer; an emitter layer of the first conductivity type formed in the surface layer portion of the channel layer so as to abut the gate trench; an emitter electrode connected with the contact layer; plural dummy gate trenches formed at equivalent intervals between the neighboring gate trenches on the upper surface side of the semiconductor substrate; dummy gate electrodes embedded in the plural dummy gate trenches and connected with the emitter electrode; and a dummy gate insulation film formed between the dummy gate electrodes and the semiconductor substrate, wherein an interval between the gate trench and the dummy gate trench that neighbor each other is shorter than an interval between the neighboring dummy gate trenches.

In the present disclosure, the interval between the gate trench and the dummy gate trench that neighbor each other is shorter than the interval between the neighboring dummy gate trenches. Accordingly, because the intervals among the dummy gate trenches are made uniform, parallel-plate capacitor approximation in the device may be achieved, and the capacitance characteristics may be improved.

Other and further objects, features and advantages of the invention will appear more fully from the following description.

DESCRIPTION OF EMBODIMENTS

A semiconductor device according to the embodiments of the present disclosure will be described with reference to the drawings. The same components will be denoted by the same symbols, and the repeated description thereof may be omitted.

First Embodiment

Figure 1:
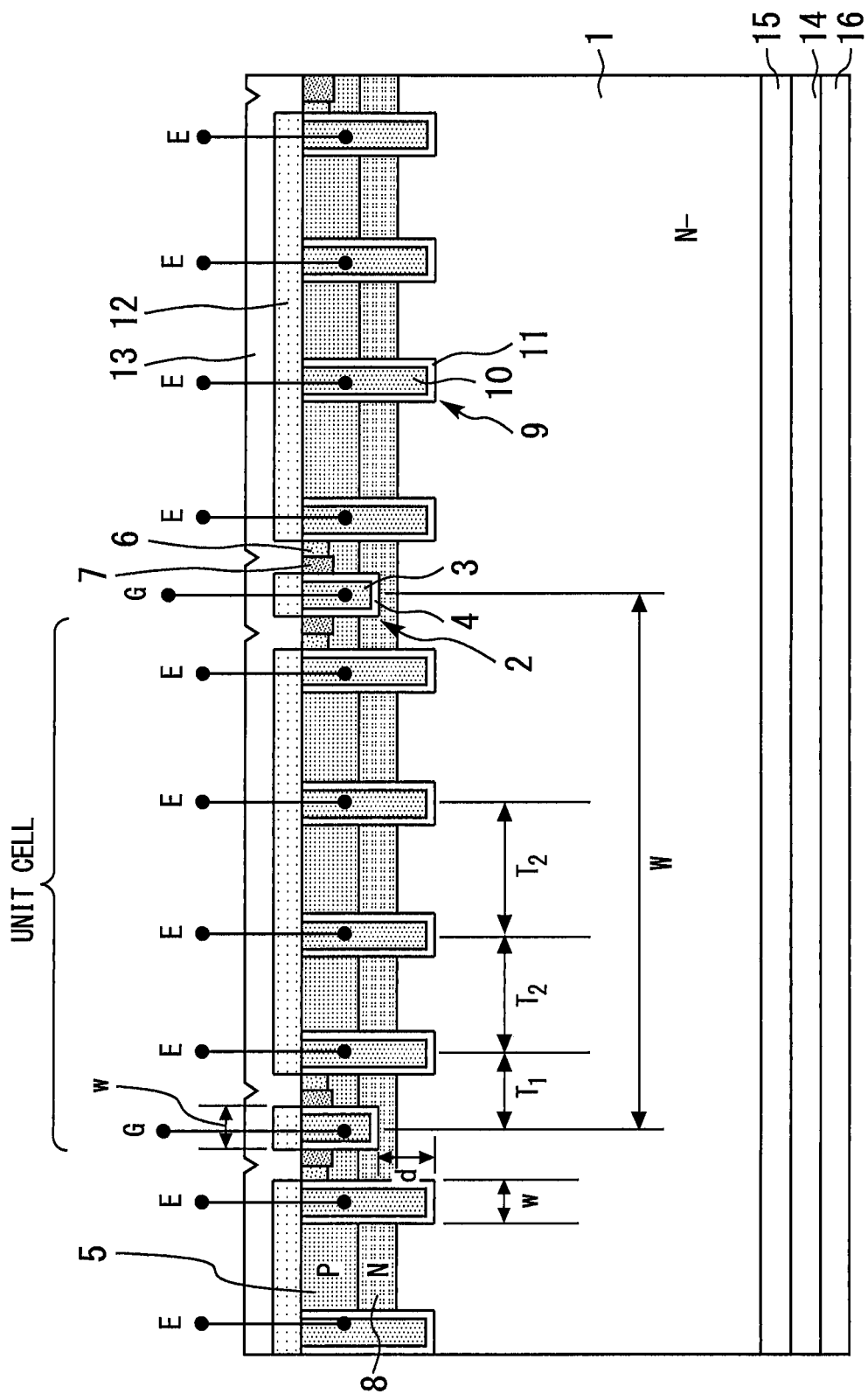
FIG. 1 is a cross-sectional view that illustrates a semiconductor device according to a first embodiment.

FIG. 1 is a cross-sectional view that illustrates a semiconductor device according to a first embodiment. A semiconductor device raised as an example here is an IGBT of a high withstand voltage class of 3,300 V; however, a withstand voltage class is not limited to this.

A main surface of an $N^-$ type semiconductor substrate 1 on an emitter side is defined as "upper surface", and a main surface on a collector side is defined as "lower surface". Plural gate trenches 2 are periodically and repeatedly formed on an upper surface side of the $N^-$ type semiconductor substrate 1. Gate electrodes 3 formed of polysilicon are embedded in the plural gate trenches 2. A gate insulation film 4 formed of silicon oxide is formed between the gate electrodes 3 and the $N^-$ type semiconductor substrate 1. That is, the gate insulation film 4 is formed on a side wall and a bottom of the gate trench 2.

A P type channel layer 5 is formed in a surface layer portion on the upper surface side of the $N^-$ type semiconductor substrate 1. A $P^+$ type contact layer 6 with a higher impurity peak concentration than the P type channel layer 5 is formed in a surface layer portion of the P type channel layer 5. An $N^+$ type emitter layer 7 is formed in the surface layer portion of the P type channel layer 5 so as to abut the gate trench 2. An N type carrier accumulation layer 8 is formed between the $N^-$ type semiconductor substrate 1 and the P type channel layer 5. The bottom of the gate trench 2 is positioned in the N type carrier accumulation layer 8.

Plural dummy gate trenches 9 are formed at equivalent intervals between the neighboring gate trenches 2 on the upper surface side of the $N^-$ type semiconductor substrate 1. Dummy gate electrodes 10 formed of polysilicon are embedded in the plural dummy gate trenches 9. A dummy gate insulation film 11 formed of silicon oxide is formed between the dummy gate electrodes 10 and the $N^-$ type semiconductor substrate 1. That is, the dummy gate insulation film 11 is formed on a side wall and a bottom of the dummy gate trench 9. The $N^+$ type emitter layer 7 is not formed on either lateral side of the dummy gate trench 9. The bottom of the dummy gate trench 9 is deeper than the N type carrier accumulation layer 8.

An interlayer insulation film 12 is formed on the upper surface of the $N^-$ type semiconductor substrate 1 so as to cover the gate electrodes 3 and the dummy gate electrodes 10. An emitter electrode 13 is formed on the interlayer insulation film 12. The emitter electrode 13 is connected with the $P^+$ type contact layer 6 and the $N^+$ type emitter layer 7 through a contact hole of the interlayer insulation film 12. The dummy gate electrode 10 is connected with the emitter electrode in a non-illustrated region. Thus, the dummy gate electrode 10 does not function as a gate electrode of an IGBT.

A P type collector layer 14 is formed in a surface layer portion on a lower surface side of the $N^-$ type semiconductor substrate 1. An N type buffer region 15 with a higher peak impurity concentration than the $N^-$ type semiconductor substrate 1 is formed between the $N^-$ type semiconductor substrate 1 and the P type collector layer 14. A collector electrode 16 is connected with the P type collector layer 14. Each of the emitter electrode 13 and the collector electrode 16 may be a laminated structure formed with plural metal films including a barrier metal or the like, for example.

The following table represents an allowable range of the peak concentration of each diffusion layer.

TABLE 1

| Diffusion Layer | Peak Concentration Allowable Range [$cm^{-3}$] |
| --- | --- |
| $N^-$ type semiconductor substrate 1 | $10^{12}$ to $10^{14}$ |
| P type channel layer 5 | $10^{16}$ to $10^{17}$ |
| N type carrier accumulation layer 8 | $10^{15}$ to $10^{16}$ |
| $P^+$ type contact layer 6 | $10^{18}$ to $10^{19}$ |
| $N^+$ type emitter layer 7 | $10^{18}$ to $10^{20}$ |

Figure 2:
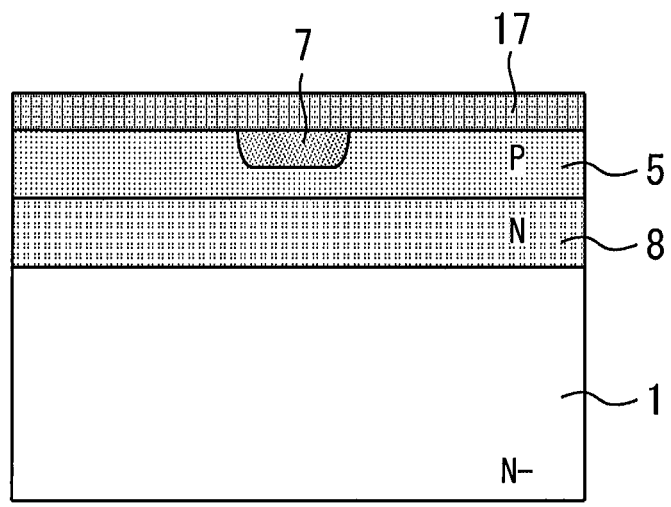
FIG. 2 is a cross-sectional view that illustrates a manufacturing method of the semiconductor device according to the first embodiment.

FIGS. 2 to 13 are cross-sectional views that illustrate a manufacturing method of the semiconductor device according to the first embodiment. As illustrated in FIG. 2, the N type carrier accumulation layer 8 and the P type channel layer 5 are formed on the upper surface side of the $N^-$ type semiconductor substrate 1, and the $N^+$ type emitter layer 7 is formed in the surface layer portion of the P type channel layer 5. A silicon oxide film 17 is formed on the $N^-$ type semiconductor substrate 1.

Figure 3:
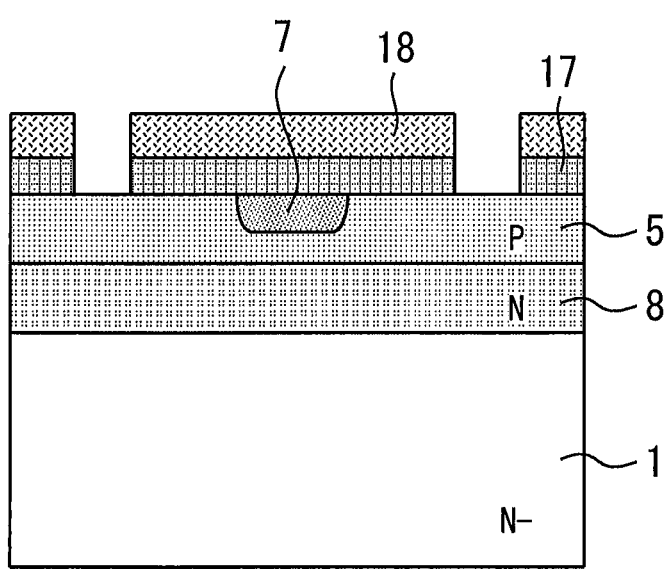
FIG. 3 is a cross-sectional view that illustrates a manufacturing method of the semiconductor device according to the first embodiment.
Figure 4:
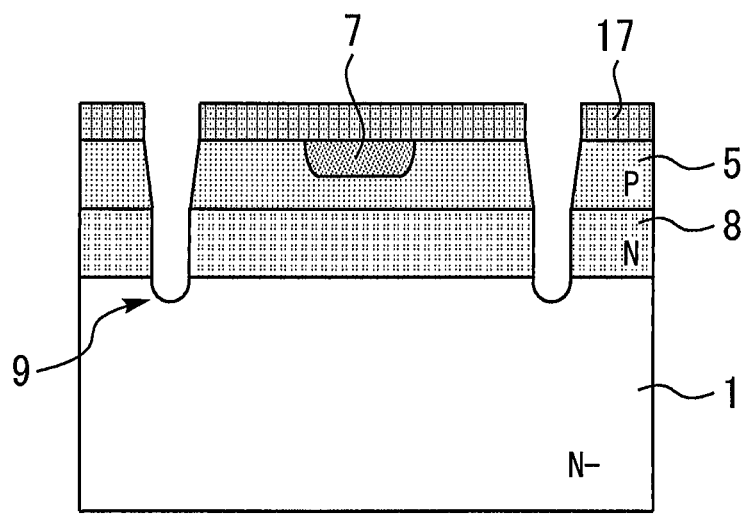
FIG. 4 is a cross-sectional view that illustrates a manufacturing method of the semiconductor device according to the first embodiment.

Next, as illustrated in FIG. 3, a resist 18 is formed on the silicon oxide film 17 and is patterned by photoengraving and etching. The silicon oxide film 17 is etched by using the patterned resist 18 as a mask. Next, as illustrated in FIG. 4, the resist 18 is removed. Next, the $N^-$ type semiconductor substrate 1 is etched by using the patterned silicon oxide film 17 as a mask, and the dummy gate trenches 9 are thereby formed. The dummy gate trenches 9 pass through the N type carrier accumulation layer 8 and the P type channel layer 5.

Figure 5:
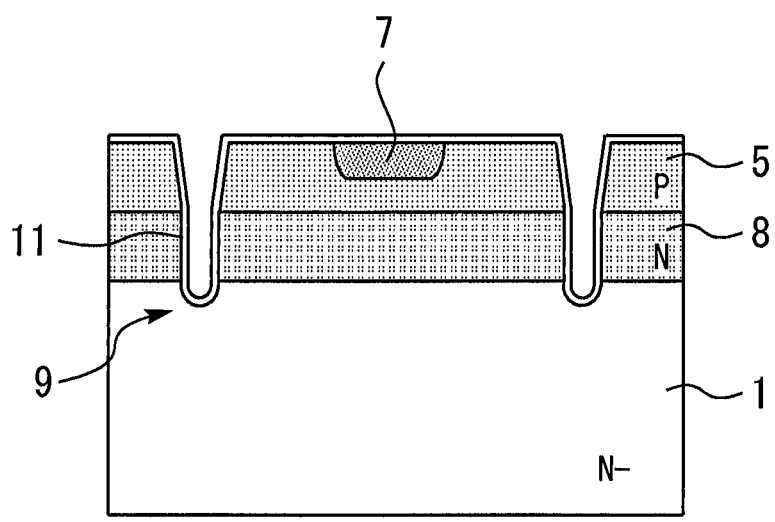
FIG. 5 is a cross-sectional view that illustrates a manufacturing method of the semiconductor device according to the first embodiment.
Figure 6:
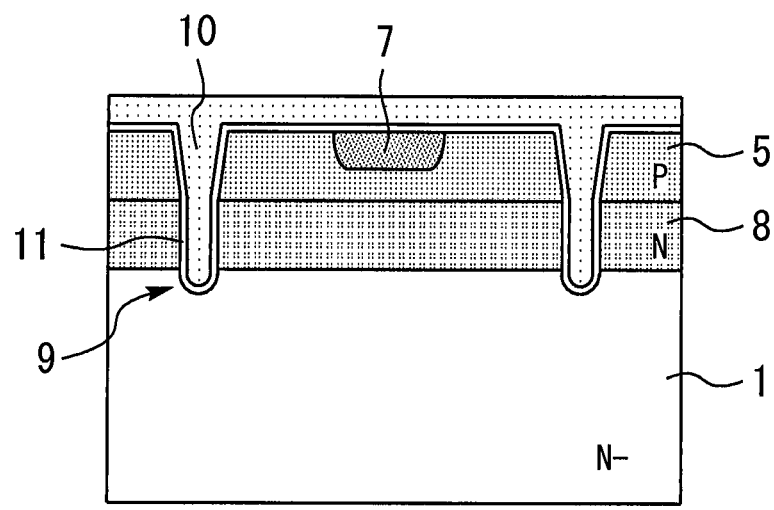
FIG. 6 is a cross-sectional view that illustrates a manufacturing method of the semiconductor device according to the first embodiment.
Figure 7:
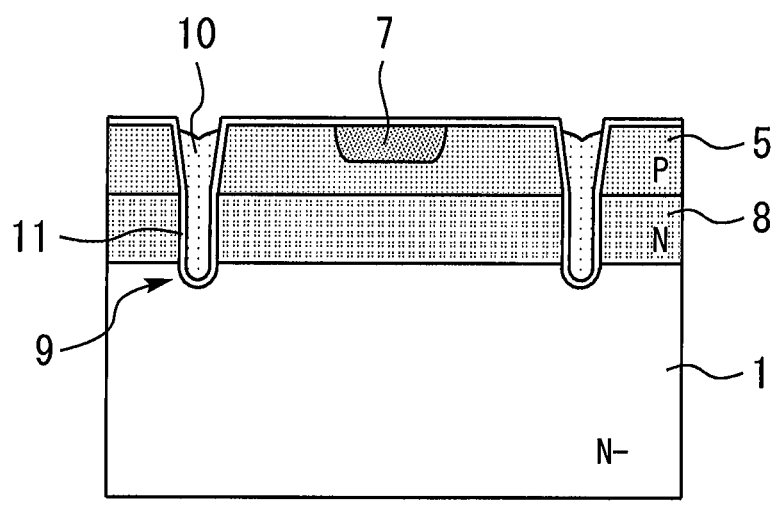
FIG. 7 is a cross-sectional view that illustrates a manufacturing method of the semiconductor device according to the first embodiment.

Next, as illustrated in FIG. 5, the silicon oxide film 17 is removed. Next, the dummy gate insulation film 11 is formed on a whole surface including inner surfaces of the dummy gate trenches 9. Next, as illustrated in FIG. 6, the dummy gate electrodes 10 are formed by embedding inner portions of the dummy gate trenches 9 with polysilicon. Next, as illustrated in FIG. 7, polysilicon except that in the inner portions of the dummy gate trenches 9 is removed.

Figure 8:
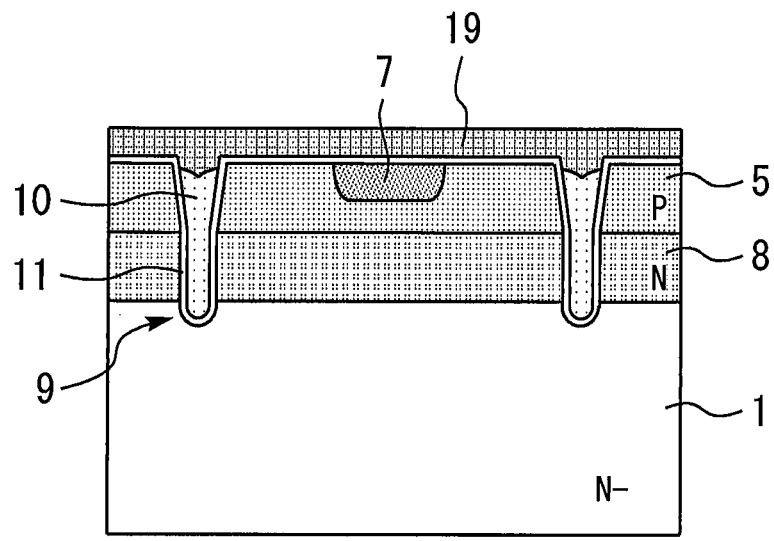
FIG. 8 is a cross-sectional view that illustrates a manufacturing method of the semiconductor device according to the first embodiment.
Figure 9:
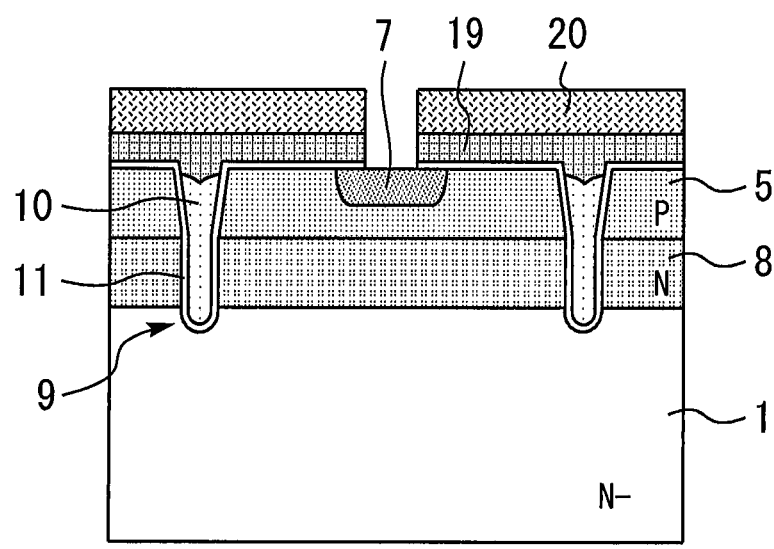
FIG. 9 is a cross-sectional view that illustrates a manufacturing method of the semiconductor device according to the first embodiment.

Next, as illustrated in FIG. 8, a silicon oxide film 19 is formed on the whole surface. Next, as illustrated in FIG. 9, a resist 20 is formed on the silicon oxide film 19 and is patterned by photoengraving and etching. The silicon oxide film 19 is etched by using the patterned resist 20 as a mask.

Figure 10:
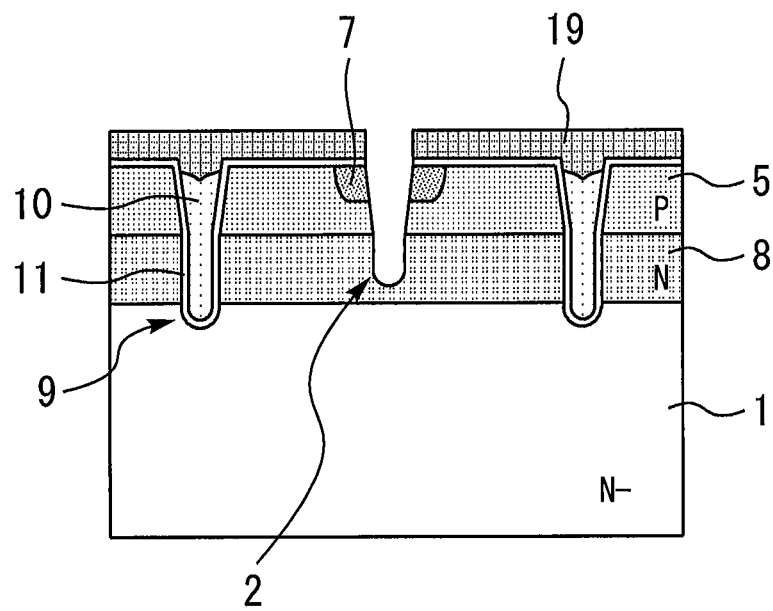
FIG. 10 is a cross-sectional view that illustrates a manufacturing method of the semiconductor device according to the first embodiment.
Figure 11:
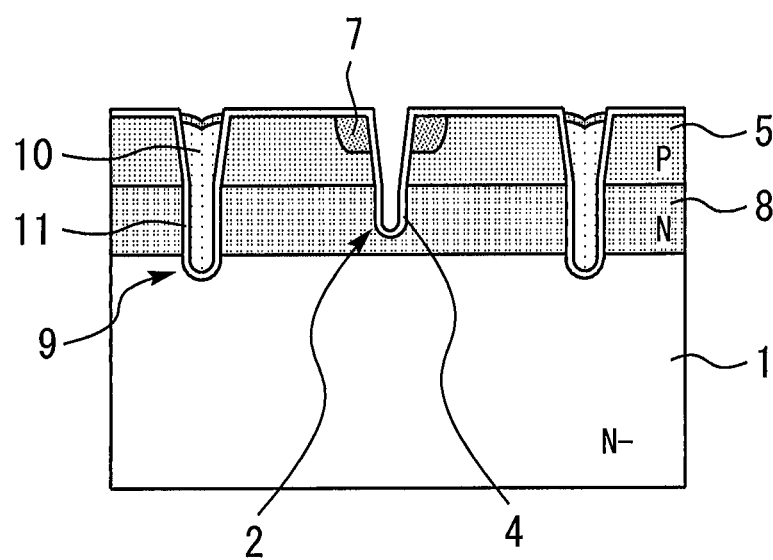
FIG. 11 is a cross-sectional view that illustrates a manufacturing method of the semiconductor device according to the first embodiment.

Next, as illustrated in FIG. 10, the resist 20 is removed. Next, the $N^-$ type semiconductor substrate 1 is etched by using the patterned silicon oxide film 19 as a mask, and the gate trench 2 is thereby formed. The gate trench 2 passes through the $N^+$ type emitter layer 7 and reaches the N type carrier accumulation layer 8. Next, as illustrated in FIG. 11, the silicon oxide film 19 is removed. Next, the gate insulation film 4 is formed on the whole surface including an inner surface of the gate trench 2.

Figure 12:
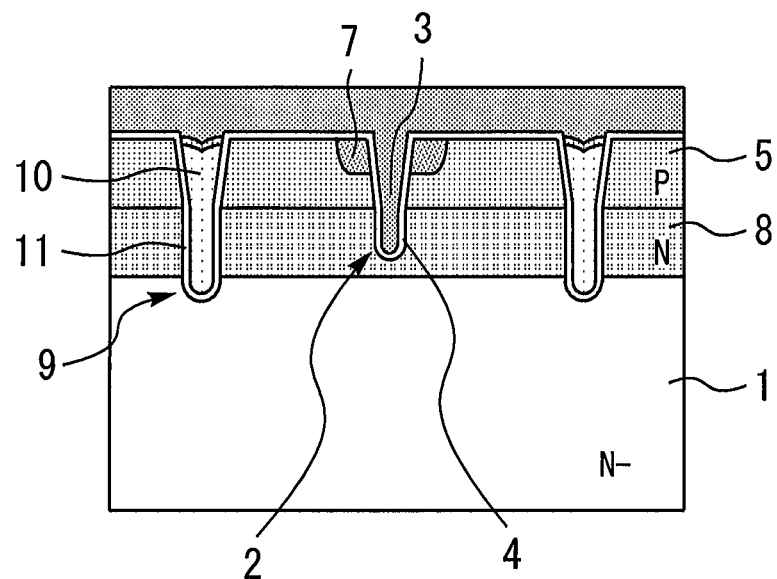
FIG. 12 is a cross-sectional view that illustrates a manufacturing method of the semiconductor device according to the first embodiment.
Figure 13:
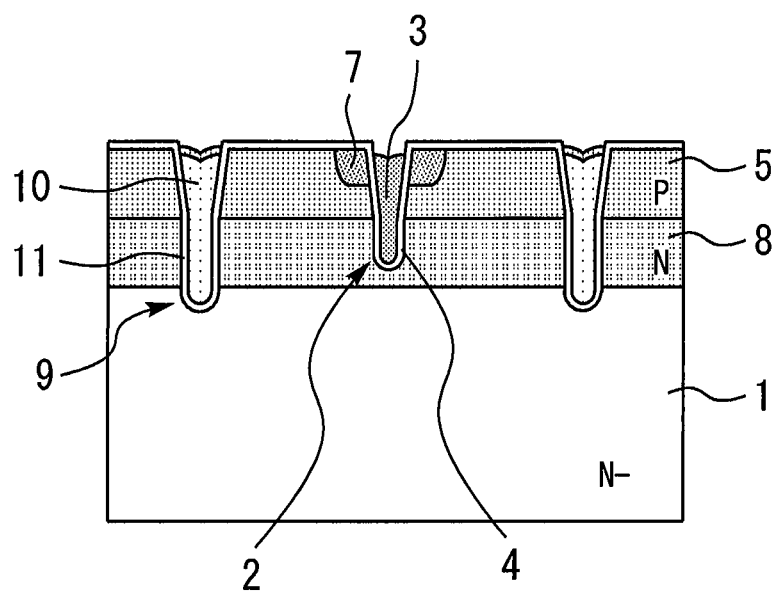
FIG. 13 is a cross-sectional view that illustrates a manufacturing method of the semiconductor device according to the first embodiment.

Next, as illustrated in FIG. 12, the gate electrode 3 is formed by embedding the inner portion of the gate trench 2 with polysilicon. Next, as illustrated in FIG. 13, polysilicon except that in the inner portion of the gate trench 2 is removed. Subsequently, the interlayer insulation film 12, the emitter electrode 13, the N type buffer region 15, the P type collector layer 14, the collector electrode 16, and so forth are formed, and the semiconductor device according to the first embodiment is thereby manufactured.

Figure 14:
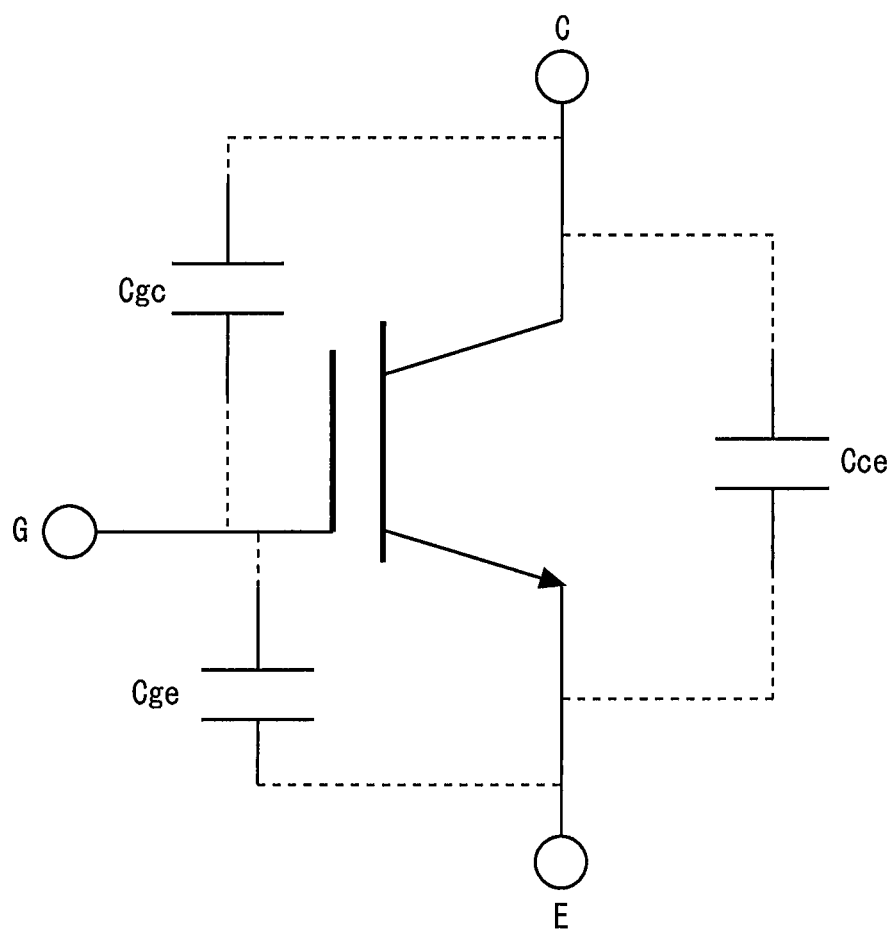
FIG. 14 is a diagram that illustrates an equivalent circuit of the semiconductor device according to the first embodiment.

FIG. 14 is a diagram that illustrates an equivalent circuit of the semiconductor device according to the first embodiment. When an input capacitance Cies and a feedback capacitance Cres become smaller, a switching operation of the semiconductor device becomes faster, and switching loss may be reduced. The input capacitance Cies is the sum of a gate-collector capacitance Cgc and a gate-emitter capacitance Cge and is determined mainly based on Cge. An output capacitance Coes is the sum of a collector-emitter capacitance Cce and the gate-collector capacitance Cgc. The feedback capacitance Cres is the gate-collector capacitance Cgc. Consequently, the output capacitance Coes and the feedback capacitance Cres are parasitic capacitances between an emitter or a gate and a collector and also depend on depletion in the N⁻ type semiconductor substrate 1.

Each of the gate trench 2 and the dummy gate trench 9 is a MOS structure configured with a semiconductor substrate, an insulation film, and a conductor. In the MOS structure, a depletion layer is produced by an applied voltage on a semiconductor substrate side in a trench bottom. Modeling is performed with this depletion layer being a P-N junction having a corner radius r. A width r of the depletion layer from the trench bottom may be calculated by the following Poisson's equation.

[Math. 1]

$$V_a = \frac{qN}{2\varepsilon_{Si}\varepsilon_0}\left[\left(\frac{r^2 - r_t^2}{2}\right) + r^2\ln\left(\frac{r}{r_t}\right)\right] \quad \text{Formula (1)}$$

Here, Va denotes an applied voltage, q denotes the elementary charge, N denotes an impurity concentration in the trench bottom, $\varepsilon_{Si}$ denotes the permittivity of Si, $\varepsilon_o$ denotes the permittivity of vacuum, and $r_t$ denotes the half value of the width of a trench.

Figure 15:
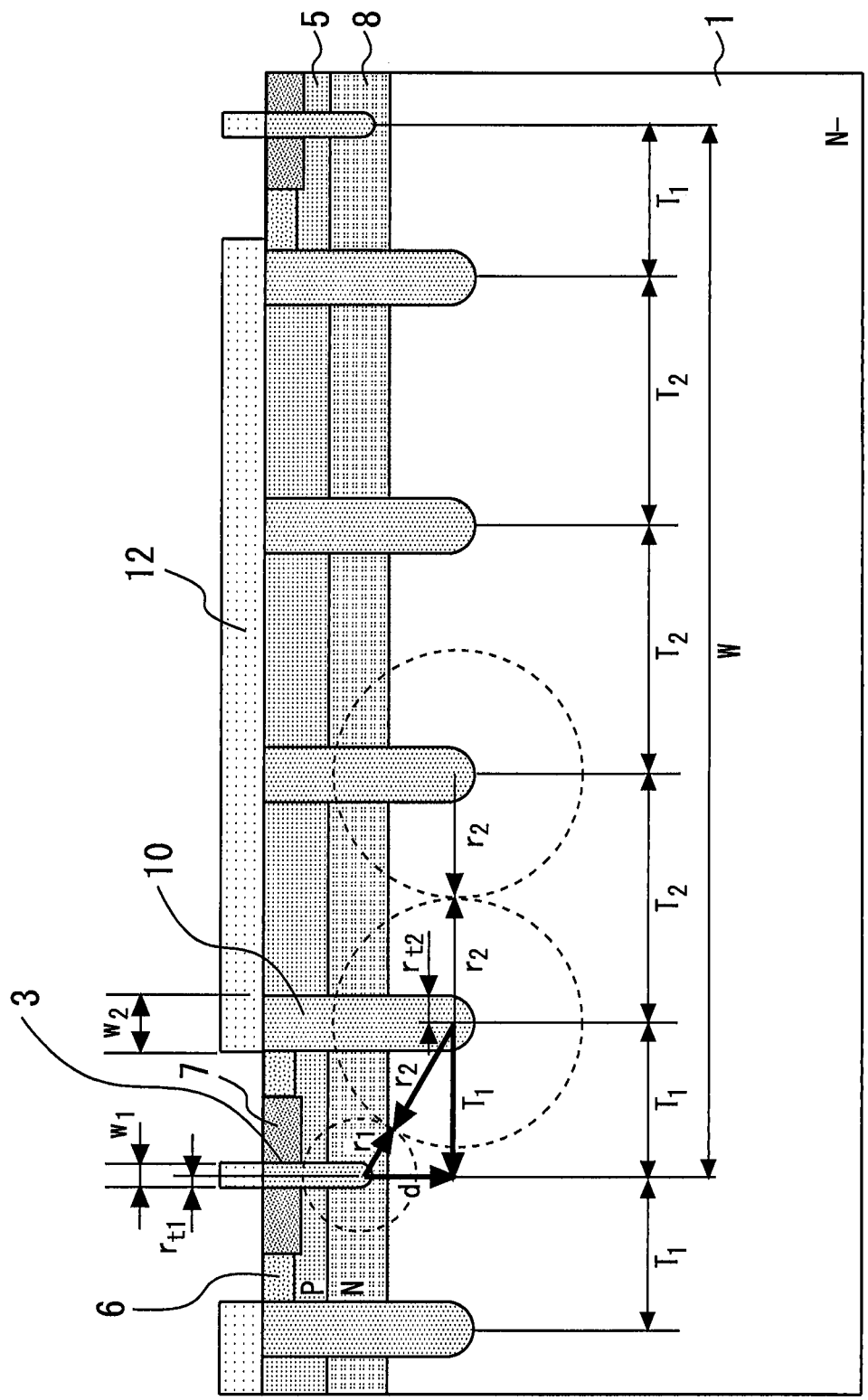
FIG. 15 is a diagram for modeling restrictions of intervals of the gate trench and the dummy gate trench.

FIG. 15 is a diagram for modeling restrictions of intervals of the gate trench and the dummy gate trench. Although FIG. 15 illustrates a case where the bottoms of the trenches are round, modeling may similarly be performed also in a case where the bottoms of the trenches are rectangular.

As it is known from the formula (1), when the applied voltage becomes greater, the depletion layers of the bottoms of the gate trench 2 and the dummy gate trench 9 expand. In order to join the depletion layers in the bottoms of the gate trench 2 and the dummy gate trench 9 together at a voltage at which the depletion layers in the bottoms of the neighboring dummy gate trenches 9 are joined together, the following formula (2) and formula (3) have to be satisfied.

$$T_1^2 \leq (r_1 + r_2)^2 - d^2 \quad \text{Formula (2)}$$

$$2r_2 = T_2 \quad \text{Formula (3)}$$

Here, $r_1$ denotes the distance from the bottom of the gate trench 2 to an end of the depletion layer, $r_2$ denotes the distance from the bottom of the dummy gate trench 9 to the end of the depletion layer, and d denotes the difference between the depths of the dummy gate trench 9 and the gate trench 2.

When a definition of $r' = r_2 - r_1$ is made, the following formula (4) is derived from the formulas (2) and (3).

$$T_1^2 \leq (2r_2 + r')^2 - d^2 \quad \text{Formula (4)}$$

As illustrated in FIG. 15, the following relationship holds for one unit cell.

[Math. 2]

$$2T_1 + (D-2) \cdot T_2 = W \quad \text{Formula (5)}$$
$$T_2 = \frac{W - 2T_1}{D - 2}$$

Here, D denotes the total number of the gate trenches 2 and the dummy gate trenches 9 included in the unit cell of the semiconductor device and denotes an integer greater than 2. A term W denotes the width of the unit cell.

The following formula (6) is derived from the formulas (3), (4), and (5).

[Math. 3]

$$T_1^2 \leq (T_2 - r')^2 - d^2 \quad \text{Formula (6)}$$
$$T_1^2 \leq \left(\frac{W - 2T_1}{D - 2} - r'\right)^2 - d^2$$
$$D \cdot (D - 4) \cdot T_1^2 + 4[W - (D-2) \cdot r'] \cdot T_1 +$$
$$(D-2)^2 \cdot d^2 - 2W^2 + [(D-2) \cdot r' + W]^2 \leq 0$$

This formula (6) is a condition for joining the depletion layers in the bottoms of the gate trench 2 and the dummy gate trench 9 together at the voltage at which the depletion layers in the bottoms of the neighboring dummy gate trenches 9 are joined together. Thus, the formula (6) has to be satisfied in order to obtain a smooth capacitance waveform.

Given that the impurity concentration in the bottom of the gate trench 2 is $N_1$, the impurity concentration in the bottom of the dummy gate trench 9 is $N_2$, the half value of the width of the gate trench 2 is $r_{t1}$, and the half value of the width of the dummy gate trench 9 is $r_{t2}$, the following formula (7) is derived from the formula (1).

[Math. 4]

$$V_a = \frac{qN_2}{2\varepsilon_{Si}\varepsilon_0}\left[\left(\frac{r_2^2 - r_{t2}^2}{2}\right) + r_2^2\ln\left(\frac{r_2}{r_{t2}}\right)\right] = \quad \text{Formula (7)}$$
$$\frac{qN_1}{2\varepsilon_{Si}\varepsilon_0}\left[\left(\frac{r_1^2 - r_{t1}^2}{2}\right) + r_1^2\ln\left(\frac{r_1}{r_{t1}}\right)\right]$$
$$N_2 \cdot \left[\left(\frac{r_2^2 - r_{t2}^2}{2}\right) + r_2^2\ln\left(\frac{r_2}{r_{t2}}\right)\right] =$$
$$N_1 \cdot \left[\left(\frac{r_1^2 - r_{t1}^2}{2}\right) + r_1^2\ln\left(\frac{r_1}{r_{t1}}\right)\right]$$
$$\frac{\left(\frac{r_1^2 - r_{t1}^2}{2}\right) + r_1^2\ln\left(\frac{r_1}{r_{t1}}\right)}{\left(\frac{r_2^2 - r_{t2}^2}{2}\right) + r_2^2\ln\left(\frac{r_2}{r_{t2}}\right)} = \frac{N_2}{N_1}$$

The terms $r_1$ and $r_2$ may be calculated from the formulas (2) and (7). Here, in a case where the widths of the gate trench 2 and the dummy gate trench 9 are the same, $r_{r1}=r_{r2}$ holds. In a case where no N type carrier accumulation layer 8 is present, $N_1=N_2$ holds. In a case of $N_1=N_2$, $r_1=r_2$, that is, r'=0 may hold.

When an interval $T_1$ is shortened, an interval $2T_1$ between the dummy gate trenches 9 on both sides of the gate trench 2 is also shortened. The value of $T_1$ satisfying $2T_1=T_2$ is the lower limit of the interval $T_1$. When the interval $T_1$ is below the lower limit, an effect of improving capacitance characteristics is not obtained. When the interval $T_1$ is excessively shortened, it is anticipated that carriers will be accumulated on an emitter side and avalanche breakdown or latch-up will occur in a concerned portion during turn-off disconnection. Consequently, the following formula (8) has to be satisfied by setting the minimum value of $T_1$ to $T_1$,min and the maximum value of $T_2$ to $T_2$,max.

[Math. 5]

$$2T_{1,min} = T_{2,max} = \frac{W}{D-1} \quad \text{Formula (8)}$$
$$T_1 \geq \frac{W}{2(D-1)}$$

Based on the above, the interval $T_1$ between the gate trench 2 and the dummy gate trench 9 that neighbor each other has to satisfy both of the formula (6) and the formula (8) at the same time. The capacitance characteristics may further be improved by restricting the interval $T_1$ in such a manner.

Figure 16:
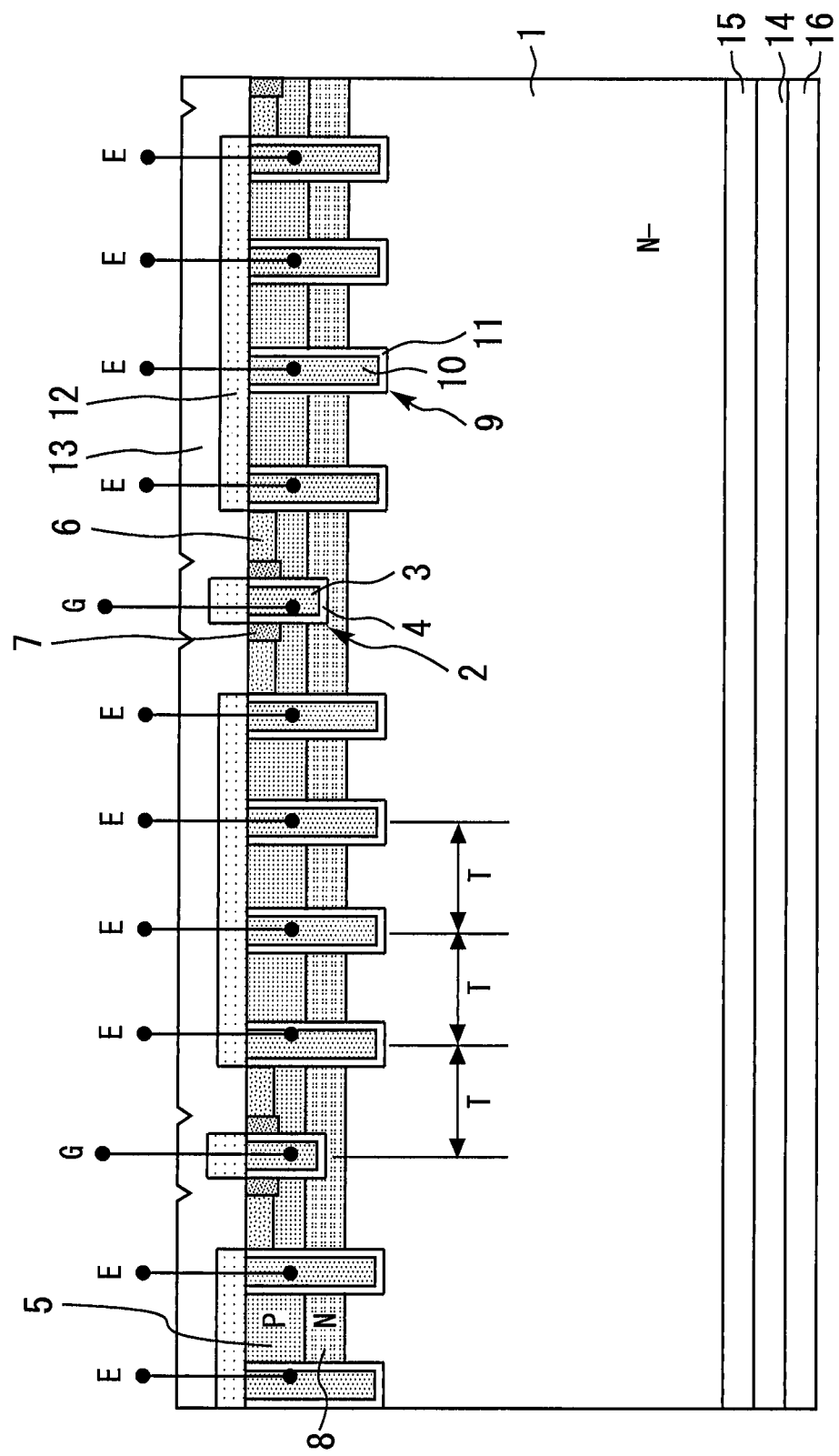
FIG. 16 is a cross-sectional view that illustrates a semiconductor device according to the comparative example.

Next, effects of this embodiment will be described by comparison with a comparative example. FIG. 16 is a cross-sectional view that illustrates a semiconductor device according to the comparative example. In the comparative example, intervals among all trenches including the gate trench 2 and the dummy gate trenches 9 are the same value T.

Figure 17:
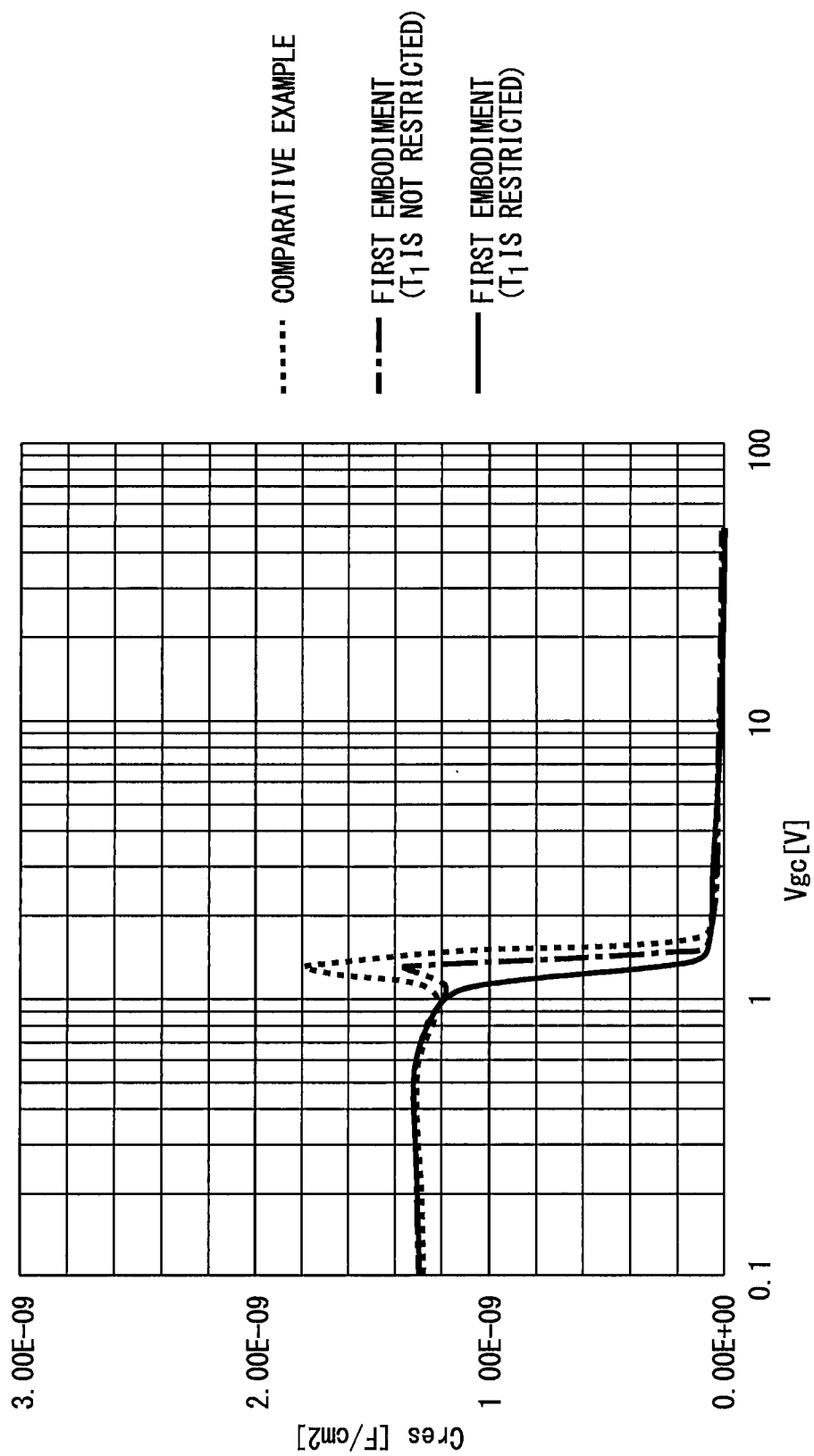
FIG. 17 is a diagram that represents actually measured capacitance waveforms of the comparative example and the first embodiment.
Figure 18:
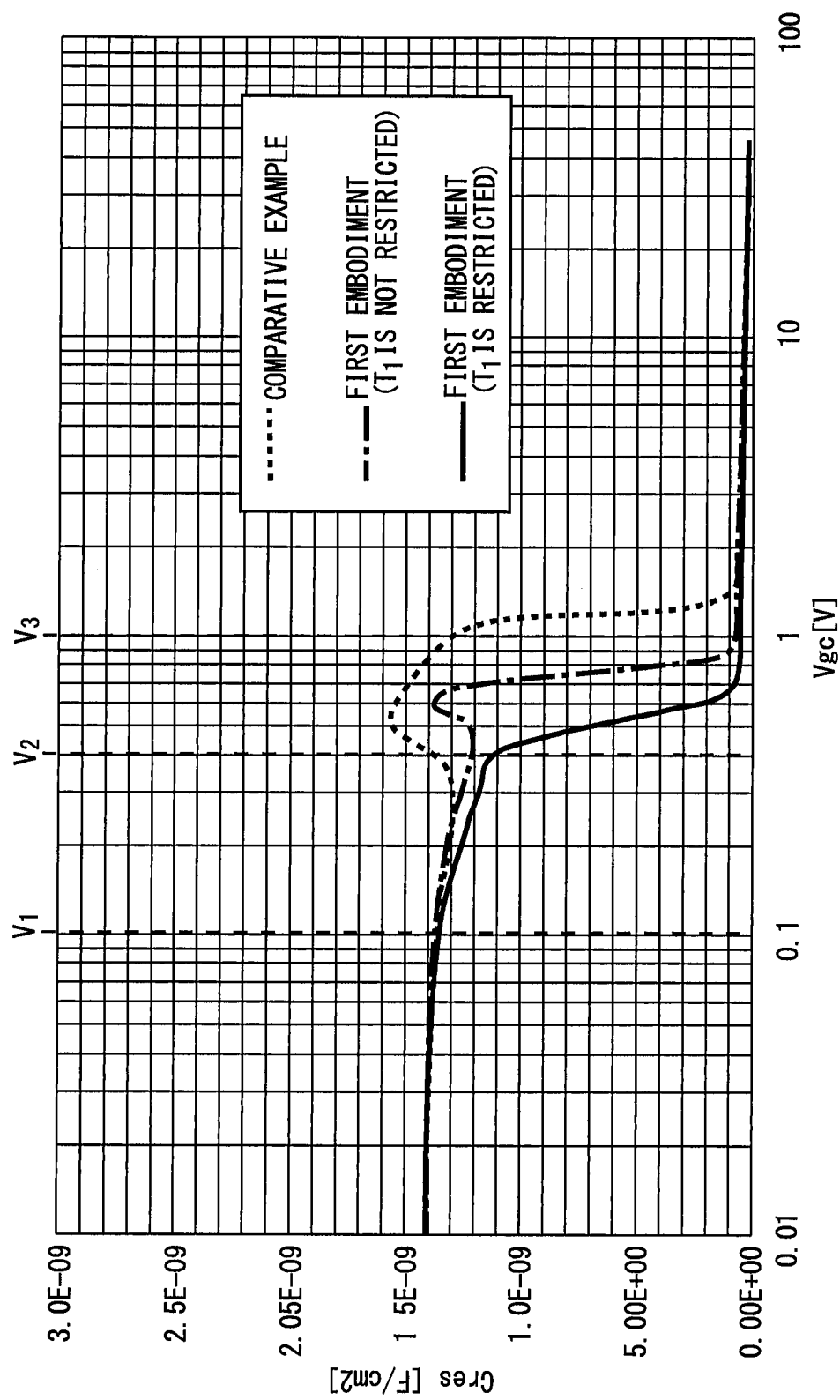
FIG. 18 is a diagram that represents simulation waveforms of capacitances of the comparative example and the first embodiment.

FIG. 17 is a diagram that represents actually measured capacitance waveforms of the comparative example and the first embodiment. FIG. 18 is a diagram that represents simulation waveforms of capacitances of the comparative example and the first embodiment. A gate-collector voltage Vgc is set to 0.1 to 50 V, a frequency is set to 100 kHz, and a temperature is set to 25° C.

The gate-collector voltage Vgc changes between a negative bias and a positive bias when the device performs a switching operation. In the comparative example, the capacitance largely changes in a range of Vgc of 1 to 2 V. Depending on the condition of use of an application, such a large change in the capacitance may incur oscillation or malfunction of the device. On the other hand, the change in the capacitance is inhibited in the first embodiment. In a case where the interval $T_1$ between the gate trench 2 and the dummy gate trench 9 that neighbor each other is not restricted, the capacitance increases in a range of Vgc of 1 to 2 V; however, in a case where the interval $T_1$ is restricted, a smooth capacitance waveform may be obtained.

Figure 19:
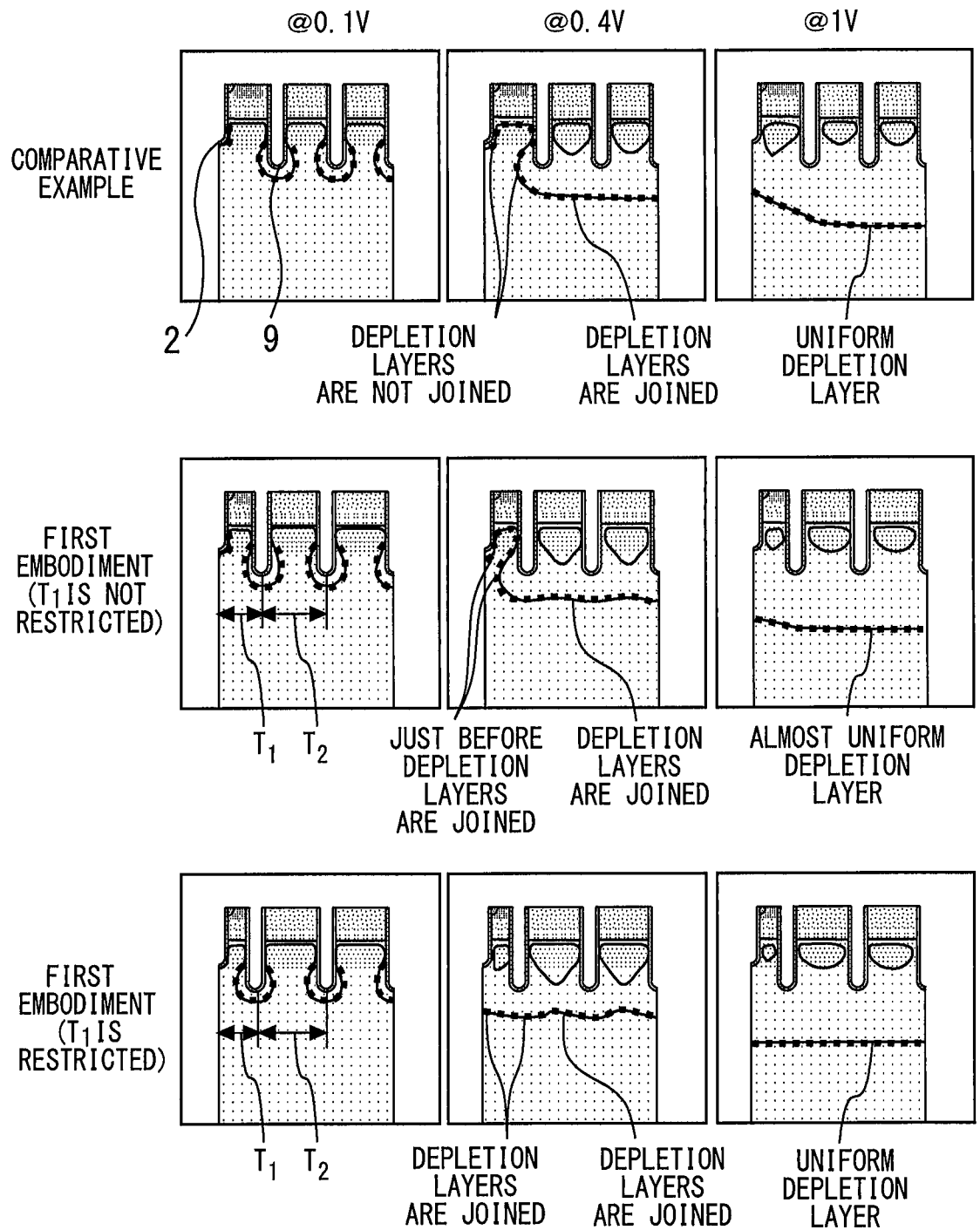
FIG. 19 is a diagram that compares inner depletion layers of the comparative example and the first embodiment.

FIG. 19 is a diagram that compares inner depletion layers of the comparative example and the first embodiment. The gate-collector voltages Vgc are 0.1 V, 0.4 V, and 1.0 V. It may be understood that less depletion occurs in the bottom of the gate trench 2 than the bottom of the dummy gate trench 9. In the comparative example, because the intervals among all trenches are constant, when only the dummy gate trenches 9 are focused, the intervals among the dummy gate trenches 9 are non-uniform in a region where the gate trench 2 is present. When the applied voltage becomes greater, the depletion layers in the bottoms of the neighboring dummy gate trenches 9 are joined together, but the depletion layers in the bottoms of the gate trench 2 and the dummy gate trench 9 that neighbor each other are not joined together. In the comparative example, parallel-plate capacitor approximation in the device may not be achieved due to such non-uniformity of the intervals of the dummy gate trenches 9 and non-uniformity of joining of the depletion layers, and a peculiar capacitance characteristic waveform is incurred.

On the other hand, in the first embodiment, the interval $T_1$ between the gate trench 2 and the dummy gate trench 9 that neighbor each other is made shorter than the interval $T_2$ between the neighboring dummy gate trenches 9. Accordingly, because the intervals among the dummy gate trenches 9 are made uniform compared to the comparative example, parallel-plate capacitor approximation in the device may be achieved, and the capacitance characteristics may be improved.

The interval $T_1$ between the gate trench 2 and the dummy gate trench 9 that neighbor each other is restricted, and it becomes easy to join together the depletion layers in the bottoms of the gate trench 2 and the dummy gate trench 9 that neighbor each other. Accordingly, because the depth of the depletion layer becomes further uniform, a peculiar capacitance waveform may be prevented, and the capacitance characteristics may further be improved.

Second Embodiment

Figure 20:
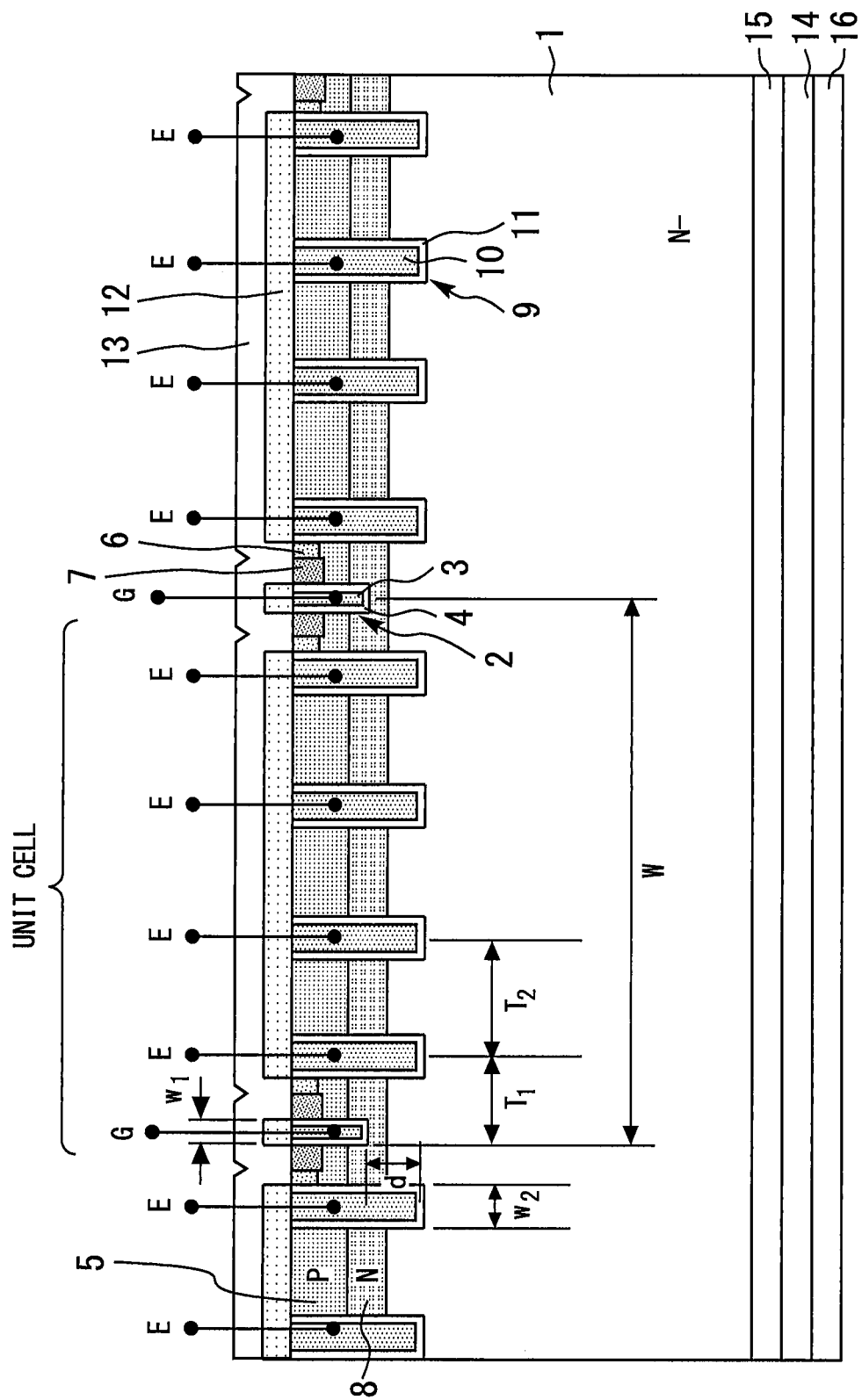
FIG. 20 is a cross-sectional view that illustrates a semiconductor device according to a second embodiment.

FIG. 20 is a cross-sectional view that illustrates a semiconductor device according to a second embodiment. A width $w_1$ of the gate trench 2 is narrower than a width $w_2$ of the dummy gate trench 9. The other configurations are the same as the first embodiment.

Figure 21:
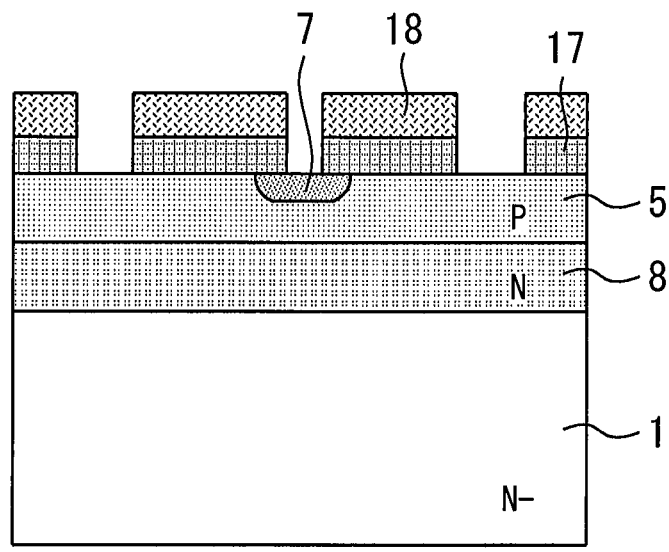
FIG. 21 is a cross-sectional view that illustrates a manufacturing process of the semiconductor device according to the second embodiment.
Figure 22:
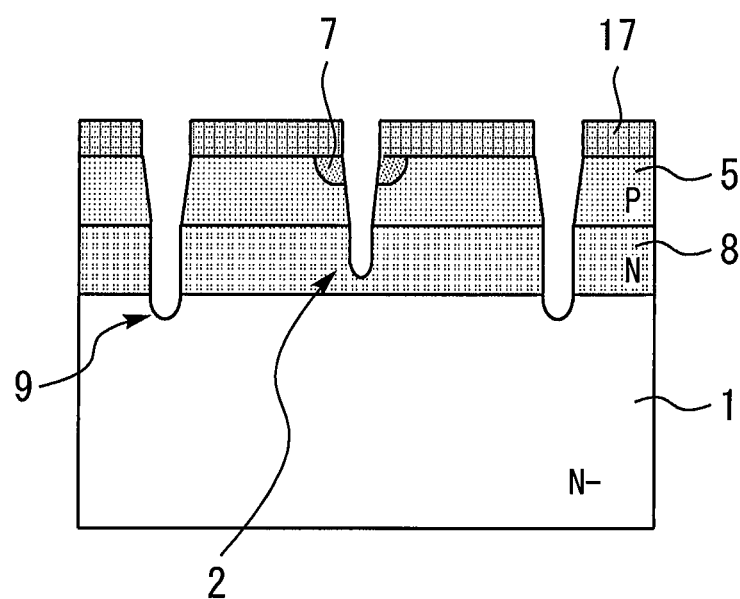
FIG. 22 is a cross-sectional view that illustrates a manufacturing process of the semiconductor device according to the second embodiment.

FIG. 21 to FIG. 25 are cross-sectional views that illustrate manufacturing processes of the semiconductor device according to the second embodiment. As illustrated in FIG. 21, the resist 18 is formed on the silicon oxide film 17 and is patterned by photoengraving and etching. The silicon oxide film 17 is etched by using the patterned resist 18 as a mask. Next, as illustrated in FIG. 22, the resist 18 is removed. Next, the N⁻ type semiconductor substrate 1 is etched by using the patterned silicon oxide film 17 as a mask, and the gate trench 2 and the dummy gate trenches 9 are thereby formed at the same time.

Figure 23:
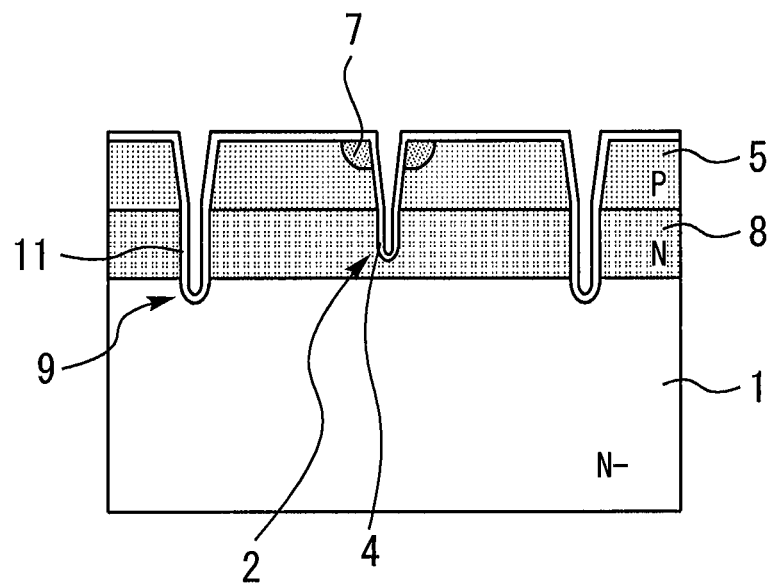
FIG. 23 is a cross-sectional view that illustrates a manufacturing process of the semiconductor device according to the second embodiment.
Figure 24:
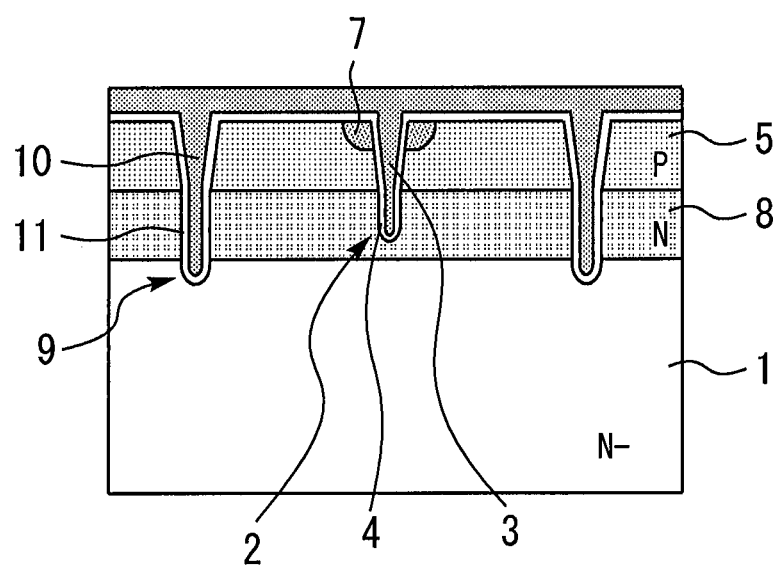
FIG. 24 is a cross-sectional view that illustrates a manufacturing process of the semiconductor device according to the second embodiment.
Figure 25:
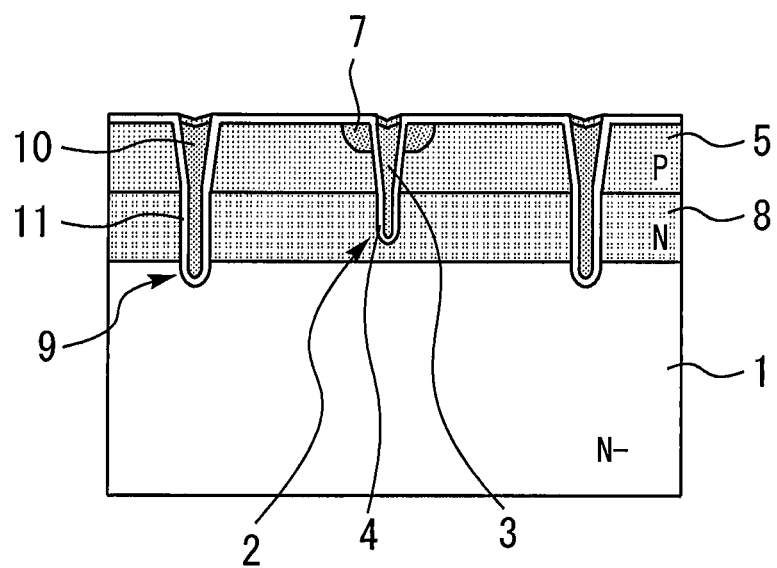
FIG. 25 is a cross-sectional view that illustrates a manufacturing process of the semiconductor device according to the second embodiment.

Next, as illustrated in FIG. 23, the silicon oxide film 17 is removed. Next, an insulation film is deposited on a whole surface including inner surfaces of the gate trench 2 and the dummy gate trenches 9, and the gate insulation film 4 and the dummy gate insulation films 11 are thereby formed at the same time. Next, as illustrated in FIG. 24, the gate electrode 3 and the dummy gate electrodes 10 are formed at the same time by embedding inner portions of the gate trench 2 and the dummy gate trenches 9 with polysilicon. Next, as illustrated in FIG. 25, polysilicon except that in the inner portions of the gate trench 2 and the dummy gate trenches 9 is removed. The other processes are the same as the first embodiment.

Figure 26:
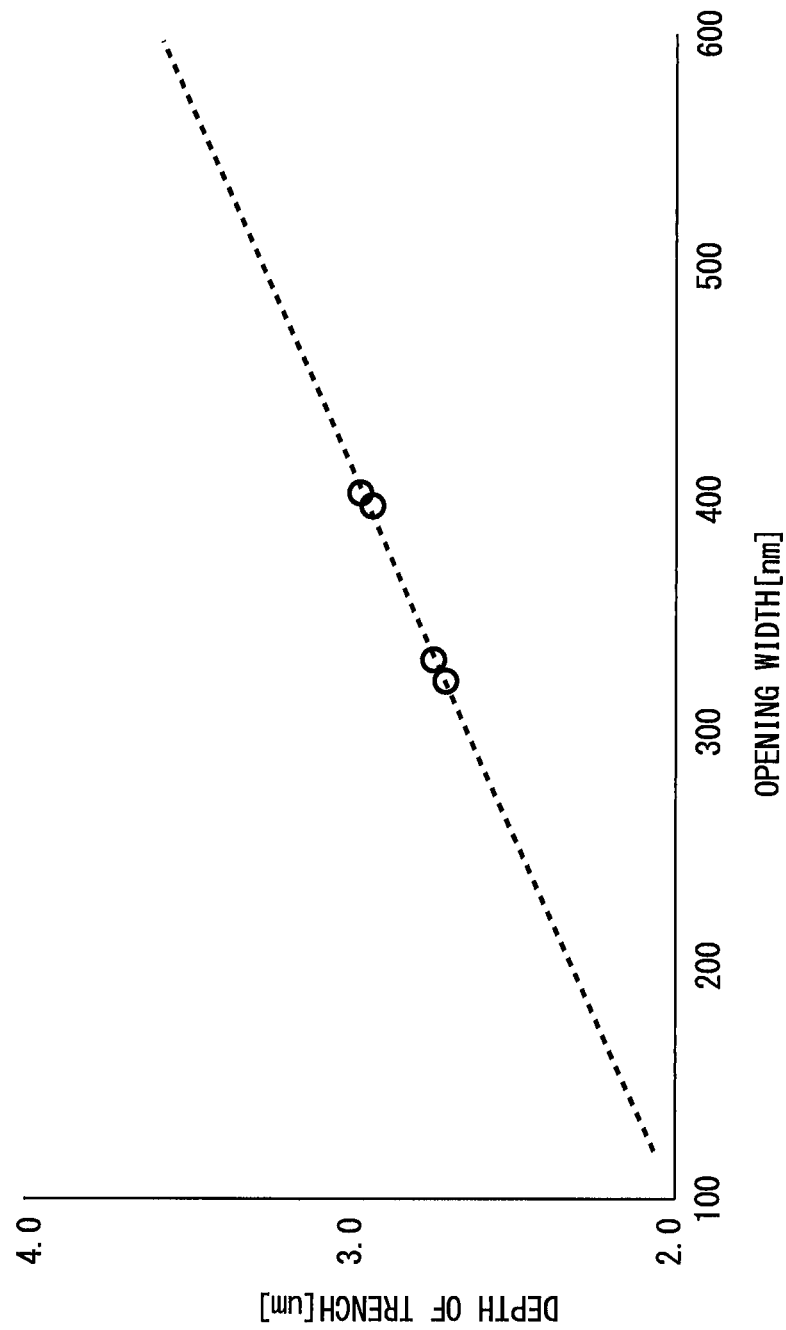
FIG. 26 is a diagram that represents the correlation between an opening width of an etching mask and a depth of the trench.

FIG. 26 is a diagram that represents the correlation between an opening width of an etching mask and a depth of the trench. It may be understood that as the opening width of the etching mask becomes wider, the trench formed by etching becomes deeper.

In the second embodiment, this correlation is used, and the dummy gate trenches 9 and the gate trenches 2 are thereby formed together by one set of photoengraving and etching processes. Meanwhile, in the first embodiment, the dummy gate trenches 9 and the gate trenches 2 are formed by separate photoengraving and etching processes. Consequently, the second embodiment may reduce a manufacturing cost compared to the first embodiment.

Figure 27:
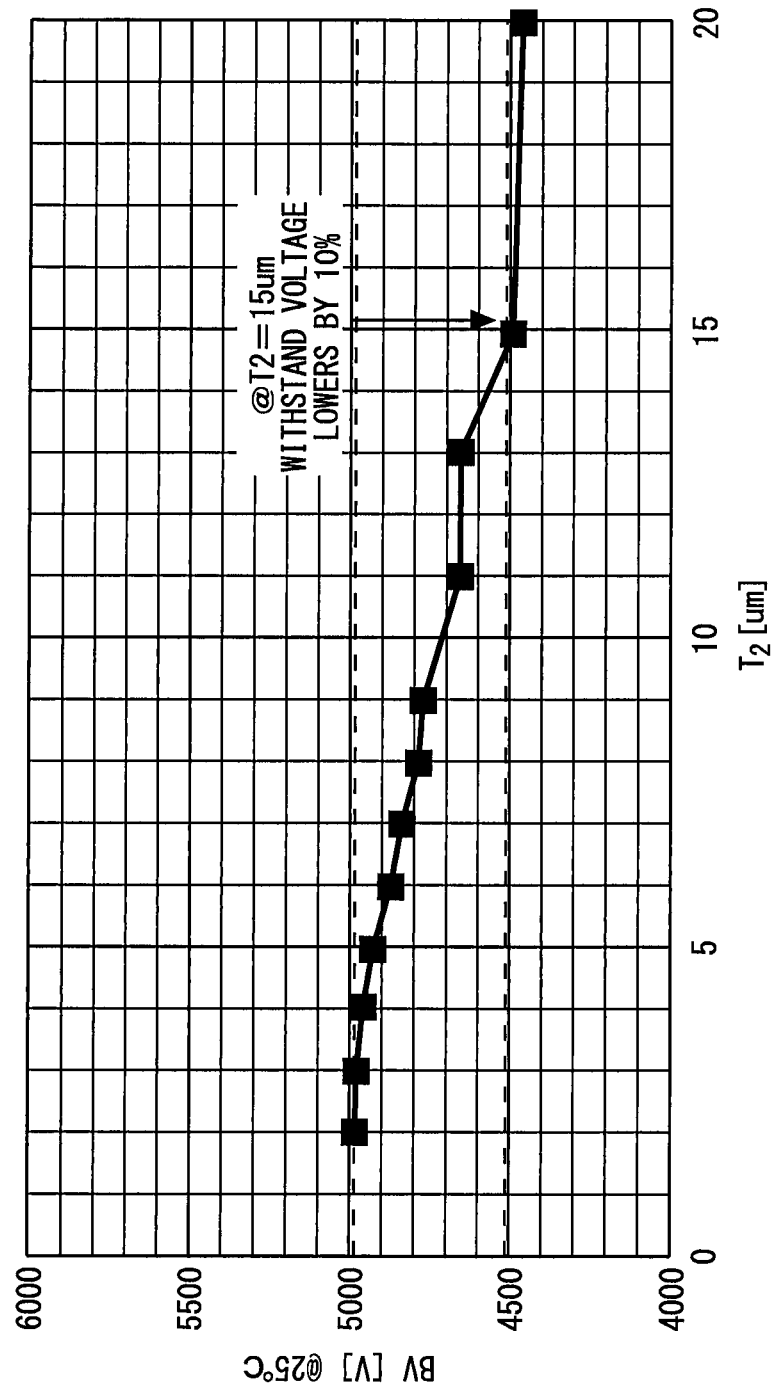
FIG. 27 is a diagram that represents the correlation between a withstand voltage in a case where no N type carrier accumulation layer is present and the interval between the dummy gate trenches.

FIG. 27 is a diagram that represents the correlation between a withstand voltage in a case where no N type carrier accumulation layer is present and the interval between the dummy gate trenches. It has been found that when the interval $T_2$ between the neighboring dummy gate trenches 9 becomes longer, the withstand voltage lowers. In a case where the filling amount of the N type carrier accumulation layer 8 is 0 and the interval $T_2$ is 15 μm, the withstand voltage corresponds to approximately 90% of a target withstand voltage. When the interval $T_2$ is excessively long, a field-plate effect between the dummy gate trenches 9 becomes weak, electric field concentration occurs in the vicinities of the bottoms of the dummy gate trenches 9, and the withstand voltage lowers. When the dosage of the N type carrier accumulation layer 8 becomes higher, an influence of the interval $T_2$ on the withstand voltage becomes larger. Consequently, in a case where the N type carrier accumulation layer 8 is present, the interval $T_2$ has to be set shorter than 15 μm in order to retain 90% or higher of the target withstand voltage.

The semiconductor substrate 1 is not limited to a substrate formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-018914, filed on Feb. 6, 2020 including specification, claims, drawings and summary, on which the convention priority of the present application is based, is incorporated herein by reference in its entirety.

The invention claimed is:

1. A semiconductor device comprising:
a semiconductor substrate of a first conductivity type;
plural gate trenches formed on an upper surface side of the semiconductor substrate;
gate electrodes embedded in the plural gate trenches;
a gate insulation film formed between the gate electrodes and the semiconductor substrate;
a channel layer of a second conductivity type formed in a surface layer portion on the upper surface side of the semiconductor substrate;
a contact layer of the second conductivity type having a higher impurity peak concentration than the channel layer and formed in a surface layer portion of the channel layer;
an emitter layer of the first conductivity type formed in the surface layer portion of the channel layer so as to abut the gate trench;
an emitter electrode connected with the contact layer;
plural dummy gate trenches formed at equivalent intervals between the neighboring gate trenches on the upper surface side of the semiconductor substrate;
dummy gate electrodes embedded in the plural dummy gate trenches and connected with the emitter electrode; and
a dummy gate insulation film formed between the dummy gate electrodes and the semiconductor substrate,
wherein an interval between the gate trench and the dummy gate trench that neighbor each other is shorter than an interval between the neighboring dummy gate trenches.

2. The semiconductor device according to claim 1, wherein the interval between the neighboring dummy gate trenches is $T_2$, a half value of a width of the gate trench is $r_{t1}$, a half value of a width of the dummy gate trench is $r_{t2}$, an impurity concentration of the semiconductor substrate in a bottom of the gate trench is $N_1$, an impurity concentration of the semiconductor substrate in a bottom of the dummy gate trench is $N_2$,
a distance $r_1$ from the bottom of the gate trench to an end of the depletion layer and a distance $r_2$ from the bottom of the dummy gate trench to the end of the depletion layer satisfy $$2r_2 = T_2$$

$$\frac{\left(\frac{r_1^2 - r_{t1}^2}{2}\right) + r_1^2 \ln\left(\frac{r_1}{r_{t1}}\right)}{\left(\frac{r_2^2 - r_{t2}^2}{2}\right) + r_2^2 \ln\left(\frac{r_2}{r_{t2}}\right)} = \frac{N_2}{N_1},$$

D is a total number of the gate trenches and the dummy gate trenches included in a unit cell of the semiconductor device, W is a width of the unit cell, d is a difference between depths of the dummy gate trench and the gate trench, $r' = r_2 - r_1$, and
an interval $T_1$ between the gate trench and the dummy gate trench that neighbor each other satisfies $$D \cdot (D-4) \cdot T_1^2 + 4[W - (D-2) \cdot r'] \cdot T_1 + (D-2)^2 \cdot d^2 - 2W^2 + [(D-2) \cdot r' + W]^2 \leq 0 T_1 \geq \frac{W}{2 \cdot (D-1)}.$$

3. The semiconductor device according to claim 2, wherein a width of the gate trench is narrower than a width of the dummy gate trench.

4. The semiconductor device according to claim 3, further comprising an N type carrier accumulation layer formed between the semiconductor substrate and the channel layer, wherein the interval between the neighboring dummy gate trenches is shorter than 15 μm.

5. The semiconductor device according to claim 4, wherein the semiconductor substrate is formed of a wide-band-gap semiconductor.

6. The semiconductor device according to claim 3, wherein the semiconductor substrate is formed of a wide-band-gap semiconductor.

7. The semiconductor device according to claim 2, further comprising an N type carrier accumulation layer formed between the semiconductor substrate and the channel layer,
wherein the interval between the neighboring dummy gate trenches is shorter than 15 µm.

8. The semiconductor device according to claim 7, wherein the semiconductor substrate is formed of a wide-band-gap semiconductor.

9. The semiconductor device according to claim 2, wherein the semiconductor substrate is formed of a wide-band-gap semiconductor.

10. The semiconductor device according to claim 1, wherein a width of the gate trench is narrower than a width of the dummy gate trench.

11. The semiconductor device according to claim 10, further comprising an N type carrier accumulation layer formed between the semiconductor substrate and the channel layer,
wherein the interval between the neighboring dummy gate trenches is shorter than 15 µm.

12. The semiconductor device according to claim 11, wherein the semiconductor substrate is formed of a wide-band-gap semiconductor.

13. The semiconductor device according to claim 10, wherein the semiconductor substrate is formed of a wide-band-gap semiconductor.

14. The semiconductor device according to claim 1, further comprising an N type carrier accumulation layer formed between the semiconductor substrate and the channel layer,
wherein the interval between the neighboring dummy gate trenches is shorter than 15 µm.

15. The semiconductor device according to claim 14, wherein the semiconductor substrate is formed of a wide-band-gap semiconductor.

16. The semiconductor device according to claim 1, wherein the semiconductor substrate is formed of a wide-band-gap semiconductor.

* * * * *